(12) United States Patent
Murohara

(10) Patent No.: US 6,867,981 B2
(45) Date of Patent: Mar. 15, 2005

(54) METHOD OF MOUNTING COMBINATION-TYPE IC CARD

(75) Inventor: Masaru Murohara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/665,420

(22) Filed: Sep. 22, 2003

(65) Prior Publication Data

US 2004/0062012 A1 Apr. 1, 2004

(30) Foreign Application Priority Data

Sep. 27, 2002 (JP) ......................... 2002-283521

(51) Int. Cl.⁷ ........................... H05K 1/00; H05K 1/14; G06K 19/07; H04B 1/00
(52) U.S. Cl. ..................... 361/737; 361/760; 361/735; 361/790; 235/492; 343/700 MS; 455/193.1
(58) Field of Search ................................ 361/735–737, 361/748, 760, 790, 795; 235/492, 494, 491, 487, 380, 457; 343/700 MS, 895, 866; 455/193.1, 193.2, 197.2, 197.3; 174/260

(56) References Cited

U.S. PATENT DOCUMENTS 5,598,032 A * 1/1997 Fidalgo ........................ 257/679
6,170,880 B1 * 1/2001 Prancz ........................... 283/86
6,719,206 B1 * 4/2004 Bashan et al. ............... 235/492

FOREIGN PATENT DOCUMENTS

JP   8-180160   7/1996
JP   2000-331137  11/2000

* cited by examiner

Primary Examiner—Kamand Cuneo
Assistant Examiner—Dameon E. Levi
(74) Attorney, Agent, or Firm—Pillsbury Winthrop LLP

(57) ABSTRACT

The invention is to set a resonance frequency to various resonance frequencies by cutting a signal line which connects a tuning capacitor for trimming and an antenna currently with a milling step making a hole for mounting an IC module.

7 Claims, 5 Drawing Sheets

METHOD OF MOUNTING COMBINATION-TYPE IC CARD

CROSS-REFERENCE TO RELATED APPLICATIONS

This application is based upon and claims the benefit of priority from the prior Japanese Patent Application No. 2002-283521, filed Sep. 27, 2002, the entire contents of which are incorporated herein by reference.

BACKGROUND OF THE INVENTION

1. Field of the Invention

The present invention relates to a method of mounting a combination-type IC card which can carry out data communication with an external terminal with both contact and contactless interfaces.

2. Description of the Related Art

The combination-type card is an IC card which can carry out the data communication with the external terminal with both the contact and contactless interfaces.

When the card is operated with the contactless interface, since it is necessary to receive electric power supply by tuning a resonance circuit in the card to a transmitted frequency from a wireless card reader/writer, the resonance circuit is formed with a pattern capacitor in which a conductor is sandwiched between both sides of a circuit substrate, and a patterned antenna, and LSI. Sometimes the capacitor is incorporated in LSI.

In the prior art, since a step in which the resonance circuit is tuned to a specific frequency (trimming step) is absent in a process of manufacturing the combination-type IC card, characteristic variation between lots of LSI or antenna becomes the variation of the resonance frequency, and communication characteristics do not exert predetermined performance.

There is also a problem that capacitor pattern to be trimmed is absent.

It is an object of the invention to provide a method of mounting a combination-type IC card, which can carry out trimming (fine-adjustment) of a tuning circuit in the combination-type IC card carrying out the data communication with an external terminal with both contact and contactless interfaces.

BRIEF SUMMARY OF THE INVENTION

According to an aspect of the present invention, there is provided a method of mounting a combination-type IC card having a tuning circuit including an antenna and at least one tuning capacitor for trimming in an antenna card and an IC module including LSI, electrically connected to the tuning circuit and mounted on the antenna card, and a contact portion connected to an external device, a resonance circuit including the tuning circuit and LSI, the method comprising: a milling step of making a hole in which the IC module is mounted in the antenna card; a trimming step of setting a resonance frequency to various resonance frequencies currently with the milling step by cutting a signal line which connects the tuning capacitor for trimming and the antenna, and an implanting step of mounting the IC module into the hole after the trimming step.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiment of the invention, and together with the general description given above and the detailed description of the preferred embodiment given below, serve to explain the principles of the invention.

DETAILED DESCRIPTION OF THE INVENTION

An IC card according to an embodiment of the invention will be described below referring to the accompanying drawings.

The IC card is a combination-type IC card 1 which can carry out data communication with a card reader/writer as an external terminal with both contact and contactless (wireless) interfaces.

Figure 1:
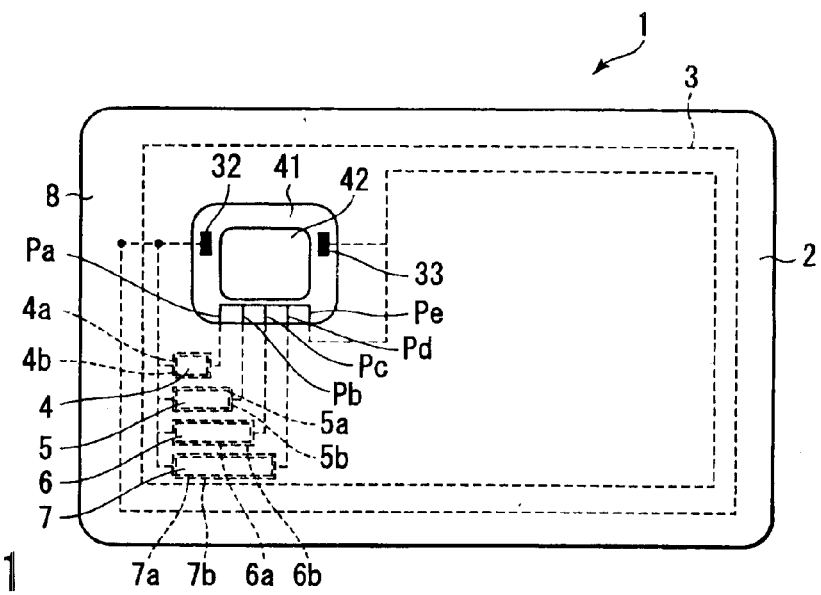
FIG. 1 shows a schematic configuration of a combination-type IC card for explaining an embodiment of the invention.
Figure 2:
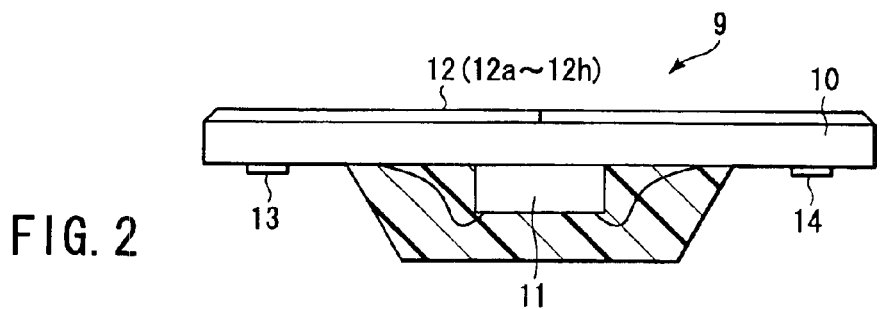
FIG. 2 shows a schematic configuration of an IC module.

As shown in FIGS. 1 and 2, the combination-type IC card 1 has a tuning circuit 8 which includes an antenna 3 and tuning capacitors for trimming (pattern capacitor) 4, 5, 6, and 7 in an antenna card 2 and an IC module 9 which is electrically connected to the tuning circuit and is mounted on the antenna card 2.

The IC module 9 has a substrate 10, an LSI 11 which is mounted on the substrate 10 by wire bonding, a contact portion 12 which is mounted on the other side of the LSI 11 of the substrate 10, and pads for connection 13 and 14.

A resonance circuit includes the tuning circuit 8 and LSI 11.

The contact portion 12 includes, e.g. a plurality of terminals 12a to 12h, which have a VCC terminal 12a for operational power voltage (+5V), an RST terminal 12b for a reset signal, a CLK terminal 12c for a clock signal, a GND terminal 12d for ground, a VPP terminal 12e for write power voltage of memory, an I/O terminal 12f for data input/output, and spare terminals 12g and 12h.

Figure 3:
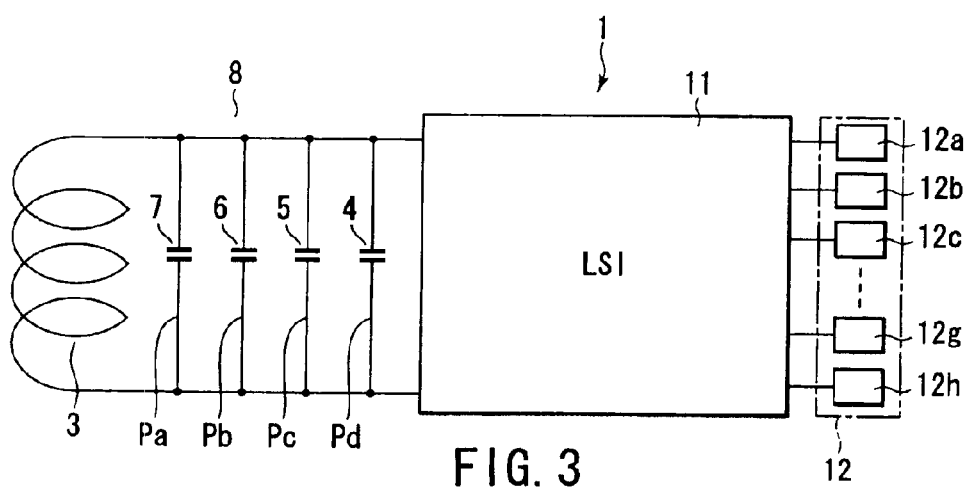
FIG. 3 shows an equivalent circuit of the combination-type IC card.

FIG. 3 is an equivalent circuit of the combination-type IC card 1 according to the invention.

The resonance circuit is formed by the antenna 3, the tuning capacitors 4, 5, 6, and 7, and the LSI 11. The combination-type IC card 1 carries out the contactless data communication in such a manner that the combination-type IC card 1 converts radio waves supplied from the outside of the card into electric power to operate the LSI 11 and transmits a response using the remaining electric power.

In the case of the contact data communication, the data communication is carried out through the contact portion 12.

In the embodiment, the resonance frequency of the combination-type IC card 1 is turned to a specific frequency. To this end, parts (Pa and Pd) of a pattern (signal line) that connects the capacitors 4 to 7 to the antenna 3 are cut, changing the capacitance of the resonant circuit and thus achieving trimming.

Figure 4:
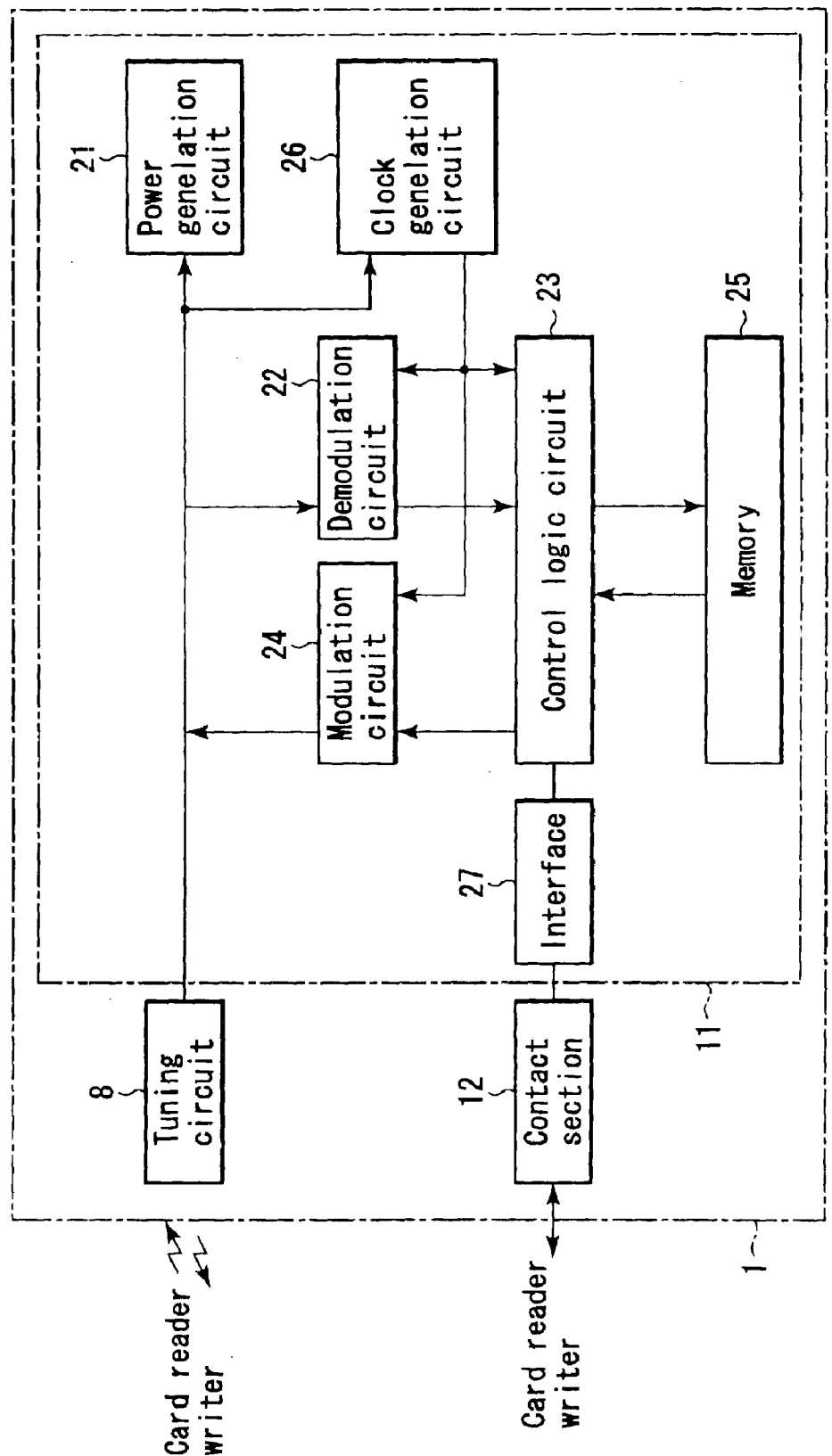
FIG. 4 shows an internal configuration of LSI.

As shown in FIG. 4, the LSI 11 includes a power generating circuit 21, a demodulating circuit 22, a control logic circuit 23, a modulating circuit 24, a memory 25, a clock generating circuit 26, and an interface 27.

The tuning circuit 8 receives a signal of the radio waves from the card reader/writer. The demodulating circuit 22 demodulates the received signal to transmit it to the control logic circuit 23, and the control logic circuit 23 carries out command analysis. Then, the control logic circuit 23 writes data in the memory 25 or reads data from the memory 25 according to the contents of the command. The control logic circuit 23 reads the data from the memory 25 to transmit it to the modulating circuit 24. The data is modulated with the modulating circuit 24 and transmitted to the card reader/writer by the radio waves using the tuning circuit 8.

The power generating circuit 21 generates the electric power consumed in the wireless card 1 from the received signal with the tuning circuit 8.

The clock generating circuit 26 generates a clock required to operate each circuit from the received signal with the tuning circuit 8, and the clock is outputted to the demodulating circuit 22, the modulating circuit 24, and the control logic circuit 23.

Accordingly, the combination-type IC card 1 carries out the contactless data communication in such a manner that the combination-type IC card 1 converts the radio waves supplied from the outside of the card (card reader/writer) into the electric power to operate the LSI 11 and transmits the response using the remaining electric power.

The interface 27 is connected to the contact portion 12, and the interface 27 carries out exchange of the data between the control logic circuit 23 and the external device (card reader/writer), which is connected to the contact portion 12 or in contact with the contact portion 12.

Figure 5:
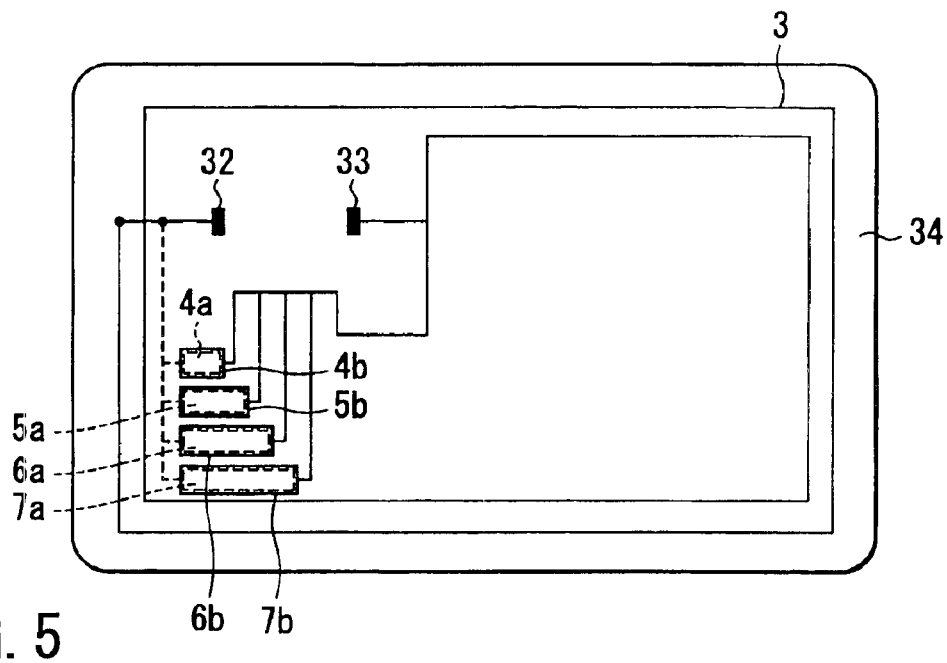
FIG. 5 shows an antenna substrate.

FIG. 5 shows an antenna substrate used in the invention.

In an antenna substrate 31, polyethylene terephthalate (hereinafter referred to as PET, not shown) having a thickness of 0.025 mm is used as a base material. Antenna terminals 32 and 33 and electrodes 4a, 5a, 6a, and 7a of the tuning capacitors 4, 5, 6, and 7, which connect the antenna 3 and the IC module 9, are formed by etching aluminum foil on one side of the antenna substrate 31. The other electrodes 4b, 5b, 6b, and 7b of the tuning capacitors 4, 5, 6, and 7, made of the same aluminum foil, are formed on the other side of the antenna substrate 31.

Thus, the tuning capacitors 4, 5, 6, and 7 have electrostatic capacity by sandwiching dielectric PET between conductive electrodes. In the embodiment, the tuning capacitors 4, 5, 6, and 7 become the capacitor having an electrode area of 1 cm×1 cm and the capacitance of 80 pF.

In the embodiment, though the same aluminum foil was used for both sides of the conductor, combinations of copper foil and the aluminum foil or silver paste may be used as the conductor.

One end of the antenna 3 is wired to the electrodes 4a, 5a, 6a, and 7a of the tuning capacitors 4, 5, 6, and 7, and the other end of the antenna 3 is wired to the electrodes 4b, 5b, 6b, and 7b of the tuning capacitors 4, 5, 6, and 7.

In the combination-type IC card 1, in order to carry out trimming to the specific resonance frequency, the tuning capacitors for trimming 4, 5, 6, and 7 are changed by simultaneously cutting their patterns in a milling step.

In a capacitance value of the capacitor for trimming, a correction value is determined by previous measurement in which a probe touches on the pads 13 and 14 of the IC module 9.

In the embodiment, though the wire bonding is adopted in the mounting method of the LSI 11, other methods such as a flip-chip method may be adopted.

Figure 6:
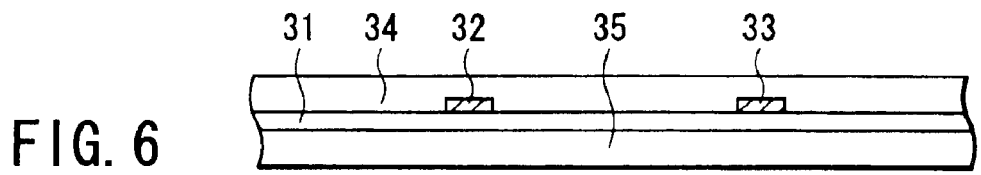
FIG. 6 is a sectional view showing the antenna substrate.
Figure 7:
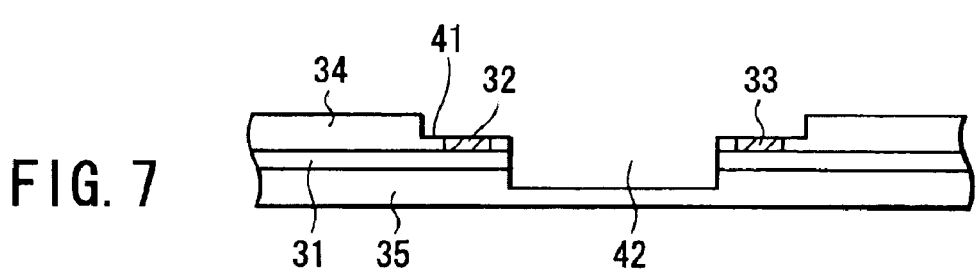
FIG. 7 is a sectional view of the card in which a milling step is completed.
Figure 8:
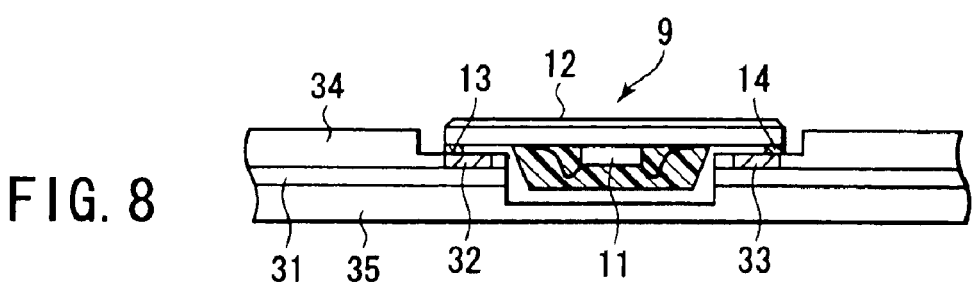
FIG. 8 is a sectional view of the card in which an implanting step is completed.

FIGS. 6 to 8 show a process flow of the combination-type IC card 1 according to the invention.

Figure 9:
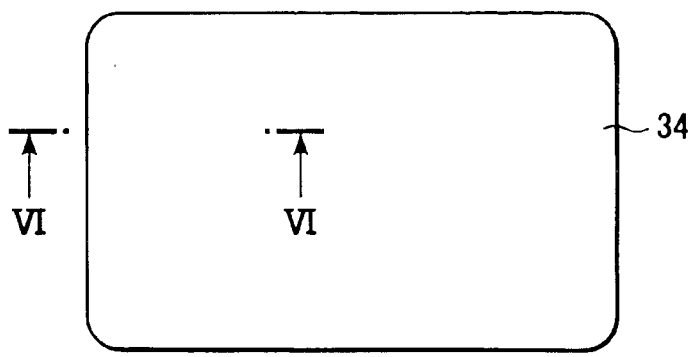
FIG. 9 shows the antenna substrate.

In an antenna card 36, as shown in FIGS. 5, 6, and 9, PET sheets or PVC sheets 34 and 35 are integrally formed on the both sides of the antenna substrate 31.

The milling is carried out at a predetermined position of the antenna card 36 in order to make holes 41 and 42 implanting the IC module 9, and the IC module 9 is implanted in an implanting step to make the combination-type IC card 1.

At this point, the resonance frequency has a value in which the capacitances of the antenna 3, the tuning capacitors 4, 5, 6, and 7, and the LSI 11 are added.

However, since there are slight variations caused by LSI manufacturing lot and the like in the capacitance of the capacitor inside LSI 11, its influence causes the resonance frequency to be outside a target value.

The invention proposes a measure which selects and cuts the tuning capacitors 4, 5, 6, and 7 in order that the variation in the capacitance of the capacitor inside the LSI 11 is corrected to establish resonance at the predetermined frequency.

The embodiment will be described in detail below.

Figure 10:
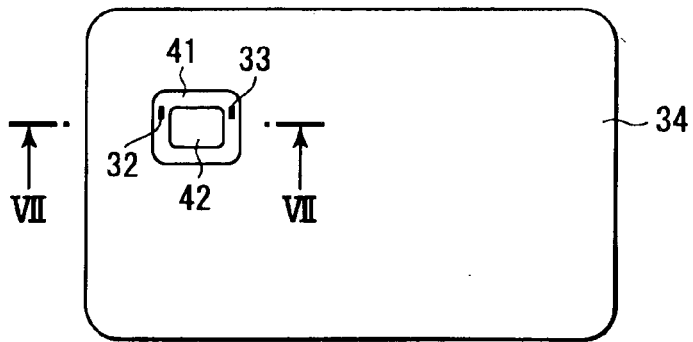
FIG. 10 is an external view of the card in which the milling step is completed.

FIGS. 1, 7, and 10 show an external view and a sectional view of the card in which the milling step has been completed. A shallow bonding hole 41 for bonding the IC module 9 and a deep bonding hole 42 for storing an LSI molding portion are present in the card, while the holes are in the concave form from the surface of the card. The parts (cut portions Pa to Pe) of the pattern connecting the antenna 3 and the capacitors 4, 5, 6, and 7 are exposed toward bottom sides of the bonding hole 41 for the IC module 9. In this case, since all the tuning capacitors 4, 5, 6, and 7 are connected, the resonance frequency of the antenna card 36 is expressed by the following equation:

$$f = \frac{1}{2\pi\sqrt{(L(C1+C2+C3+C4))}}$$

where the capacitances of the tuning capacitors 4, 5, 6, and 7 are set to C1, C2, C3, and C4, respectively.

Figure 11:
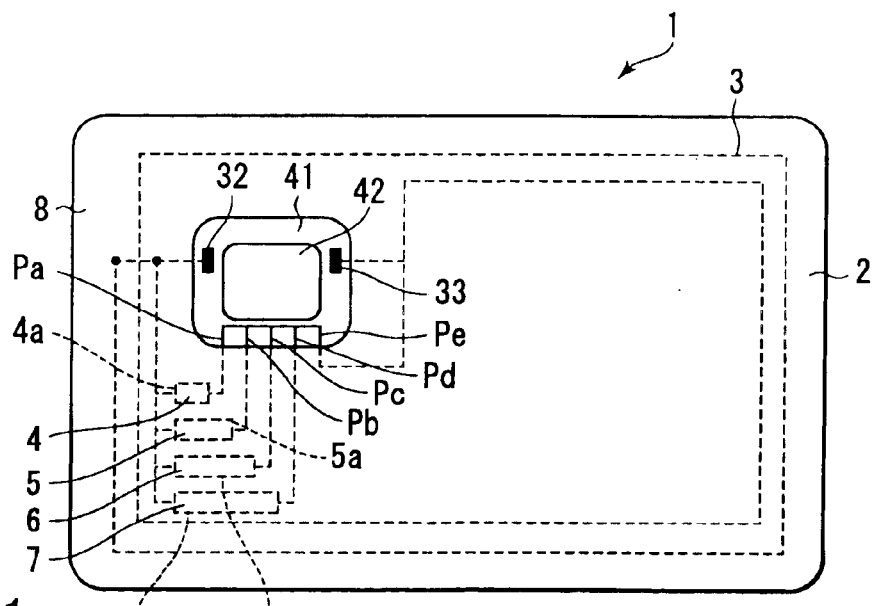
FIG. 11 shows a state in which a cut portion of a capacitor pattern (signal line) is cut.

However, in the case that it is found from previous inspection that the inner capacitance of the IC module 9 is larger than an estimated value by (C1+C2), as shown in FIG. 11, the cut portions Pa and Pb of the capacitor pattern (signal line) connected to the tuning capacitors 4 and 5 are cut to adjust the capacitance in the trimming step.

In the embodiment, the cut portions Pa and Pb of the capacitor pattern are cut with a cutter used in the milling at the same time when the milling step is carried out, so that the dedicated cutter for trimming is not particularly required.

The pattern may be cut with the cutter for trimming.

When the cut portion Pe is cut, the capacitances of the tuning capacitors 4, 5, 6, and 7 are cut.

As shown in FIG. 1, since the cut portions Pa to Pe of the capacitor pattern are arranged at the side different from the sides where the antenna connecting terminals 32 and 33 are located, even if a conductive bonding agent is used in order to connect the antenna connecting terminals 32 and 33 and the IC module 9, there is little fear that the conductive bonding agent overflows and the cut pattern is short-circuited.

Accordingly, this can prevent the risk that the conductive bonding agent overflows and the cut capacitor is connected again in the case that the antenna connecting terminals 32 and 33 and the cut portions Pa to Pd of the capacitor pattern are provided on the same side.

Figure 12:
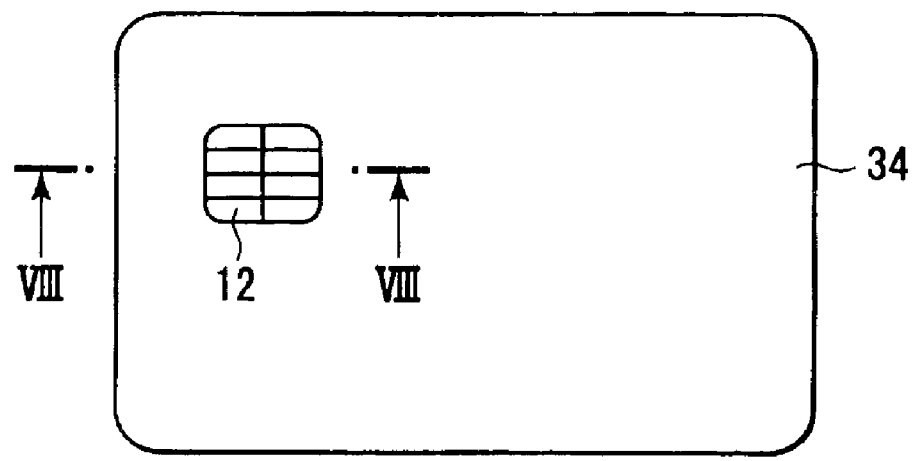
FIG. 12 is an external view of the card in which the implanting step is completed.

In the embodiment, through the implanting step shown in FIG. 8, the IC module 9 to which an anisotropic conductive bonding film (not shown) is pre-bonded is dropped into the bonding holes 41 and 42, pressed with heat, and electrically and physically connected to form the combination-type IC card 1 shown in FIG. 12.

The tuning circuit 8 and the LSI 11 are connected in such a manner that the pads 13 and 14 of the IC module 9 are connected to the antenna connecting terminals 32 and 33, respectively.

As described above, for example, since the capacitance of the capacitor inside the LSI 11 slightly has the variation from the manufacturing lot of the LSI 11, its influence causes the resonance frequency to be outside a target resonance frequency f.

In order to correct the variation in the capacitance of the capacitor inside the LSI 11 to establish resonance at the predetermined frequency, the tuning capacitors for trimming 4, 5, 6, and 7 are selected and connected. As a result, even in the case of the combination-type IC card, a certain communication range can be obtained.

The case in which the variations in the resonance frequencies of a first several LSIs in lot unit are measured and the pattern to be trimmed is determined is described in the embodiment. However, the variation in the resonance frequency of individual LSI may be measured and the pattern to be trimmed may be determined.

Figure 13:
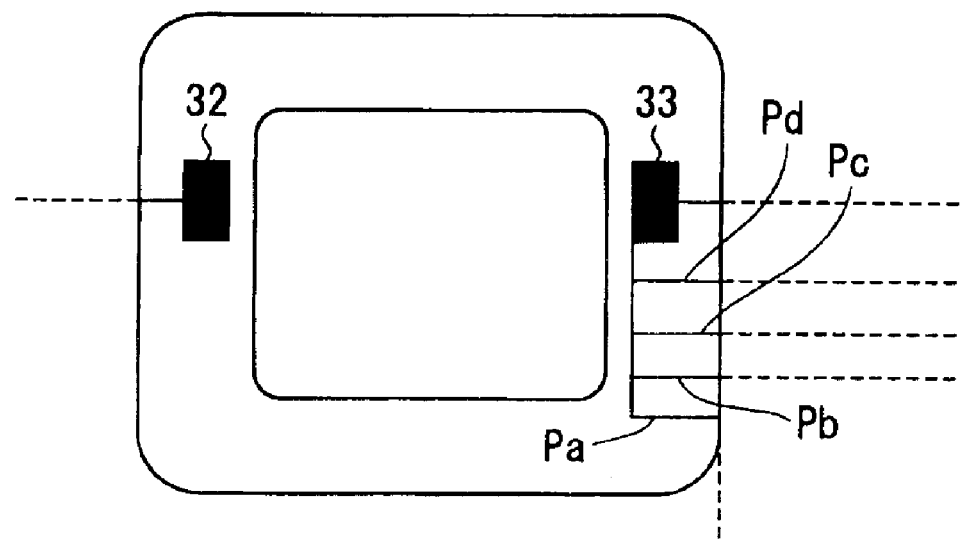
FIG. 13 shows a layout example of the cut portion of the capacitor pattern.

Although the cut portions Ps to Pd of the capacitor pattern are arranged at the side different from the sides where the antenna connecting terminals 32 and 33 are located in the embodiment, the invention is not limited to the embodiment, and as shown in FIG. 13, the cut portions Ps to Pd of the capacitor pattern and the antenna connecting terminal 32 or 33 may be arranged at the same side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of mounting a combination-type IC card having: (i) a tuning circuit including an antenna and a tuning capacitor for trimming on a first substrate; (ii) an IC module electrically connected to the tuning circuit and mounted on the first substrate, wherein the IC module including an LSI, and a contact portion connected to an external device, the LSI and the contact portion mounted on a second substrate; and (iii) a resonance circuit including the tuning circuit and the LSI, wherein the method of mounting a combination-type IC card comprising:

a milling step of making a hole in the first substrate in which the IC module is mounted;

a trimming step of setting a resonance frequency to one of various resonance frequencies by selectively cutting a signal line which connects the tuning capacitor for trimming and the antenna; and an implanting step of mounting the IC module into the hole formed in the first substrate after the trimming step.

2. The method according to claim 1, wherein the signal line to be trimmed is exposed in forming a rectangular hole, in which the IC module is mounted, in the first substrate through the milling step.

3. The method according to claim 1, wherein the signal line to be cut is exposed at a side different from a side where both end terminals of the antenna are exposed in forming a rectangular hole, in which the IC module is mounted, in the first substrate through the milling step.

4. The method according to claim 1, wherein the signal line to be cut is provided at a position where the signal line is exposed after milling through the milling step.

5. A mounting method of a combination-type IC card according to claim 1, wherein the trimming step carries out trimming by cutting a part of an exposed pattern exposed after milling through the milling step.

6. A combination-type card comprising:

an antenna card having a tuning circuit including an antenna and at least one tuning capacitor, the antenna having antenna terminals and being mounted on a first substrate, and the at least one tuning condenser being connected to the antenna and the antenna terminals via a signal line; and an IC module; (i) electrically connected to the tuning circuit; (ii) mounted on the first substrate; and (iii) including an LSI, a contact portion connected to an external device, and antenna-connecting terminals, the LSI, the contact portion and the antenna-connecting terminals mounted an a second substrate, wherein the antenna-connecting terminals of the IC module and the antenna of the antenna card are electrically connected, thereby configuring a resonant circuit including the tuning circuit and the LSI, and wherein a resonance frequency of the resonant circuit is adjusted to one of various resonance frequencies by selectively cutting the signal lines.

7. The combination-type card according to claim 6, wherein a signal line is selectively cut when a hole is made in the first substrate to hold the IC module.

* * * * *